United States Patent
Pavao

(10) Patent No.: US 9,046,250 B2
(45) Date of Patent: Jun. 2, 2015

(54) CIRCUIT BOARD ASSEMBLY THAT INCLUDES PLURAL LEDS ELECTRICALLY CONNECTED TO UNDERLYING PADS

(75) Inventor: Pascal Pavao, St-Jerome (CA)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/001,013

(22) PCT Filed: Feb. 28, 2012

(86) PCT No.: PCT/IB2012/050916
§ 371 (c)(1),
(2), (4) Date: Aug. 22, 2013

(87) PCT Pub. No.: WO2012/117345
PCT Pub. Date: Sep. 7, 2012

(65) Prior Publication Data
US 2013/0329427 A1    Dec. 12, 2013

Related U.S. Application Data

(60) Provisional application No. 61/448,819, filed on Mar. 3, 2011.

(51) Int. Cl.
| | |
|---|---|
| H01L 33/62 | (2010.01) |
| F21V 15/04 | (2006.01) |
| H01L 33/48 | (2010.01) |
| H05K 1/18 | (2006.01) |
| F21V 15/00 | (2006.01) |
| H05K 13/00 | (2006.01) |

(52) U.S. Cl.
CPC .............. *F21V 15/04* (2013.01); *H01L 33/486* (2013.01); *H05K 1/181* (2013.01); *H05K 2201/10106* (2013.01); *F21V 15/00* (2013.01); *H05K 13/00* (2013.01)

(58) Field of Classification Search
USPC ....................................................... 174/259
See application file for complete search history.

(56) References Cited

U.S. PATENT DOCUMENTS

| | | | |
|---|---|---|---|
| 5,081,563 | A | 1/1992 | Feng et al. |
| 7,637,630 | B2 | 12/2009 | Wilcox et al. |
| 7,845,829 | B2 | 12/2010 | Shaner |
| 2005/0116235 | A1 | 6/2005 | Schultz et al. |
| 2005/0174781 | A1 | 8/2005 | Howe |
| 2007/0126112 | A1 | 6/2007 | Cho et al. |
| 2009/0026485 | A1* | 1/2009 | Urano et al. ................. 257/99 |
| 2009/0041994 | A1 | 2/2009 | Ockenfuss et al. |
| 2009/0290334 | A1 | 11/2009 | Ivey et al. |
| 2009/0290345 | A1 | 11/2009 | Shaner |
| 2011/0019416 | A1* | 1/2011 | Poissonnet et al. ...... 362/249.02 |
| 2011/0019417 | A1* | 1/2011 | Van Laanen et al. .... 362/249.02 |

* cited by examiner

*Primary Examiner* — Stephen W Smoot
(74) *Attorney, Agent, or Firm* — Yuliya R. Mathis

(57) ABSTRACT

Methods and apparatus related to a circuit board having a dielectric layer (140A/B, 240A/B, 340, 440, 340B, 440B) on the top and/or bottom thereof. A circuit board is provided having a core layer (110, 210, 310, 410) and at least one conductive layer (130A/B, 132A/B, 230A/B, 232A/B, 330, 430) positioned on a first side of the core layer (110, 210, 310, 410). An outer dielectric layer (140A/B, 240A/B, 340, 440, 340B, 440B) is provided atop an outermost of the at least one conductive layer (130A/B, 132A/B, 230A/B, 232A/B, 330, 430). The dielectric layer (140A/B, 240A/B, 340, 440, 340B, 440B) includes a plurality of openings (334A, 336A, 445A) that provide access to at least one of connection pads and vias that are in electrical contact with one or more of the conductive layer(s) (130A/B, 132A/B, 230A/B, 232A/B, 330, 430).

20 Claims, 6 Drawing Sheets

CIRCUIT BOARD ASSEMBLY THAT INCLUDES PLURAL LEDS ELECTRICALLY CONNECTED TO UNDERLYING PADS

TECHNICAL FIELD

The present invention is directed generally to a circuit board. More particularly, various inventive methods and apparatus disclosed herein relate to a circuit board having a dielectric layer on the top and/or bottom thereof.

BACKGROUND

Circuit boards may be utilized in a variety of electrical apparatus. For example, circuit boards may be utilized in computing devices for supporting and/or electrically connecting a plurality of electrical components such as, for example, processor(s), transistor(s), capacitor(s), and/or inductor(s). Also, circuit boards may be utilized in lighting fixtures for supporting and/or electrically connecting a plurality of electrical components such as, for example, LED(s), processor(s), capacitor(s), and/or inductor(s). In certain implementations, it may be desirable to make circuit boards that are flame-retardant and/or shock-resistant or shock-preventive.

More particularly, it may be desirable to make flame-retardant and/or shock-preventive circuit boards in the field of lighting in order to meet certain safety goals and/or achieve certain safety standards related to lighting fixtures. As an example, standards employed by Underwriter Laboratories (UL) for Class 1 Luminaires require a certain level of flame-retardant, fire enclosure, and/or shock-preventive characteristics from a circuit board of a lighting fixture. Methods utilized in the lighting fixture field to conform to such UL norms (and/or to achieve other safety standards or safety goals) include the use of a flame resistant meta-aramid material between the circuit board and lenses that are provided atop LEDs attached to the circuit board. Utilized methods may additionally or alternatively include the use of a flame-retardant material for the lenses that are provided atop LEDs attached to the circuit board. However, such methodologies have one or more drawbacks such as, for example, increased materials cost, increased labor costs, and/or increased complexity of the lighting fixture design.

Thus, there is a need in the art to provide a circuit board that provides satisfactory flame-retardant, fire enclosure, and/or shock-preventive characteristics while optionally overcoming one or more drawbacks of previous methods and apparatus.

SUMMARY

The present disclosure is directed to inventive methods and apparatus for a circuit board having a dielectric layer on the top and/or bottom thereof that provides at least one of flame-retardant, flame-enclosure, and shock-preventive characteristics. For example, in some implementations, a circuit board is provided having a core layer and at least one conductive layer positioned on a first side of the core layer. An outer dielectric layer is provided atop an outermost of the at least one conductive layer. The dielectric layer includes a plurality of openings that provide access to at least one of connection pads and vias that are in electrical contact with one or more of the conductive layer(s). The outer dielectric layer may be generally exposed and is optionally generally continuous except for the openings.

Generally, in one aspect, a circuit board assembly is provided that includes a core layer and at least one conductive layer positioned on a first side of the core layer. The conductive layer and the core layer are cohesively bonded together and form a circuit board. A plurality of connection pads are in electrical connectivity with the at least one conductive layer. An outer dielectric layer is directly atop an outermost of the at least one conductive layer. The outer dielectric layer includes a plurality of openings each providing electrical access to one of the connection pads. The outer dielectric layer is substantially exposed and is substantially continuous except for the openings. A plurality of LEDs are each electrically connected to a single of the connection pads. The LEDs substantially cover the connection pads when electrically connected thereto.

In some embodiments the core layer is aluminum. In some versions of those embodiments the circuit board assembly further includes a dielectric inner layer immediately atop the core layer on the first side thereof. The core layer may be a pre-preg material.

In some embodiments a plurality of the conductive layers are provided. In some versions of those embodiments, the circuit board assembly further includes a dielectric inner layer provided between two of the conductive layers.

In some embodiments, the circuit board assembly further includes a plurality of non-fire rated optical lenses each placed over one of the LEDs. At least some of the connection pads may be cohesively integrally formed with the conductive layer and/or may include solder that is bonded with the conductive layer.

Generally, in another aspect, a circuit board assembly is provided that includes a core layer, at least one top conductive layer placed on a top side of the core layer, and at least one bottom conductive layer placed on a bottom side of the core layer. The core layer, the top conductive layer, and the bottom conductive layer are cohesively bonded together and form a circuit board. A plurality of at least one of connection pads and vias are in electrical connectivity with at least one of the top conductive layer and the bottom conductive layer. An outer dielectric layer is directly atop an outermost of the at least one top conductive layer. The outer dielectric layer includes a plurality of openings providing electrical access to the at least one of connection pads and vias. The outer dielectric layer is exposed and continuous except for the openings. A plurality of electrical components are each electrically connected to a single of the at least one of connection pads and vias. The electrical components prevent external physical access to the at least one of connection pads and vias when electrically connected thereto.

In some embodiments, the circuit board assembly further includes a dielectric bottom layer directly below an outermost of the at least one bottom conductive layer. In some versions of those embodiments the dielectric bottom layer is continuous. In some versions of those embodiments the dielectric bottom layer includes a plurality of bottom openings providing electrical access to the at least one of connection pads and vias.

In some embodiments, a plurality of the top conductive layers is provided. In some versions of those embodiments, the circuit board assembly further includes a dielectric inner layer provided between two of the top conductive layers.

In some embodiments, the at least one of connection pads and vias comprise solder bonded to at least one of the top conductive layer and the bottom conductive layer.

Generally, in another aspect, a method of manufacturing a circuit board assembly is provided. The method includes the steps of: positioning an outermost conductive layer on a first side of a core layer, the conductive layer including a plurality of connection pads; positioning an outer dielectric layer directly atop the outermost conductive layer and aligning each of a plurality of openings in the dielectric layer with a single of the connection pads; compressing the core layer, the outermost conductive layer, and the outer dielectric layer together to form a circuit board; and coupling each of a plurality of electrical components to a single of the connection pads, wherein the electrical components prevent external physical access to the connection pads when coupled thereto.

In some embodiments, the method further includes the step of positioning a dielectric inner layer directly atop the core layer. The electrical components may include LEDs, and the method further includes the step positioning a plurality of non-fire rated optical lenses over the LEDs. The outermost conductive layer may include or consist essentially of copper.

As used herein for purposes of the present disclosure, the term "LED" should be understood to include any electroluminescent diode or other type of carrier injection/junction-based system that is capable of generating radiation in response to an electric signal. Thus, the term LED includes, but is not limited to, various semiconductor-based structures that emit light in response to current, light emitting polymers, organic light emitting diodes (OLEDs), electroluminescent strips, and the like. In particular, the term LED refers to light emitting diodes of all types (including semi-conductor and organic light emitting diodes) that may be configured to generate radiation in one or more of the infrared spectrum, ultraviolet spectrum, and various portions of the visible spectrum (generally including radiation wavelengths from approximately 400 nanometers to approximately 700 nanometers).

For example, one implementation of an LED configured to generate essentially white light (e.g., a white LED) may include a number of dies which respectively emit different spectra of electroluminescence that, in combination, mix to form essentially white light. In another implementation, a white light LED may be associated with a phosphor material that converts electroluminescence having a first spectrum to a different second spectrum. In one example of this implementation, electroluminescence having a relatively short wavelength and narrow bandwidth spectrum "pumps" the phosphor material, which in turn radiates longer wavelength radiation having a somewhat broader spectrum.

It should also be understood that the term LED does not limit the physical and/or electrical package type of an LED. For example, as discussed above, an LED may refer to a single light emitting device having multiple dies that are configured to respectively emit different spectra of radiation (e.g., that may or may not be individually controllable). Also, an LED may be associated with a phosphor that is considered as an integral part of the LED (e.g., some types of white LEDs). In general, the term LED may refer to packaged LEDs, non-packaged LEDs, surface mount LEDs, chip-on-board LEDs, T-package mount LEDs, radial package LEDs, power package LEDs, LEDs including some type of encasement and/or optical element (e.g., a diffusing lens), etc.

The term "lighting fixture" is used herein to refer to an implementation or arrangement of one or more lighting units in a particular form factor, assembly, or package. The term "lighting unit" is used herein to refer to an apparatus including one or more light sources of same or different types. A given lighting unit may have any one of a variety of mounting arrangements for the light source(s), enclosure/housing arrangements and shapes, and/or electrical and mechanical connection configurations. Additionally, a given lighting unit optionally may be associated with (e.g., include, be coupled to and/or packaged together with) various other components (e.g., control circuitry) relating to the operation of the light source(s). An "LED-based lighting unit" refers to a lighting unit that includes one or more LED-based light sources as discussed above, alone or in combination with other non LED-based light sources. A "multi-channel" lighting unit refers to an LED-based or non LED-based lighting unit that includes at least two light sources configured to respectively generate different spectrums of radiation, wherein each different source spectrum may be referred to as a "channel" of the multi-channel lighting unit.

The term "controller" is used herein generally to describe various apparatus relating to the operation of one or more light sources. A controller can be implemented in numerous ways (e.g., such as with dedicated hardware) to perform various functions discussed herein. A "processor" is one example of a controller which employs one or more microprocessors that may be programmed using software (e.g., microcode) to perform various functions discussed herein. A controller may be implemented with or without employing a processor, and also may be implemented as a combination of dedicated hardware to perform some functions and a processor (e.g., one or more programmed microprocessors and associated circuitry) to perform other functions. Examples of controller components that may be employed in various embodiments of the present disclosure include, but are not limited to, conventional microprocessors, application specific integrated circuits (ASICs), and field-programmable gate arrays (FPGAs).

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DETAILED DESCRIPTION

Circuit boards may be utilized in a variety of electrical apparatus such as computing devices and/or lighting fixtures for supporting and/or electrically connecting a plurality of electrical components. In certain implementations it may be desirable to make circuit boards with improved environmental reliability and safety features. For example, it may be desirable to make circuit boards that are flame-retardant and/or shock-preventive in order to meet certain safety goals and/or achieve certain safety standards. Methods utilized in the lighting fixture field to conform to such desires include the use of a flame resistant meta-aramid material between the circuit board and lenses provided atop LEDs attached to the circuit board and/or the use of a flame-retardant material for the lenses. However, such methodologies have one or more drawbacks such as, for example, increased materials cost, increased labor costs, and/or increased complexity of the lighting fixture design. Thus, Applicants have recognized and appreciated that it would be beneficial to provide a circuit board that includes an outer dielectric layer provided atop an outermost conductive layer of the circuit board. The outer dielectric layer may provide flame-retardant, fire enclosure, and/or shock-preventive characteristics and include one or more openings to provide electrical access to the conductive layer(s) of the circuit board. The circuit board with outer dielectric layer may optionally overcome one or more drawbacks of previous methods and apparatus. For example, when utilized in the lighting fixture field, the circuit board with outer dielectric layer may provide shock-preventive, flame enclosure, and/or flame-retardant characteristics without necessitating the use of flame resistant meta-aramid material and/or flame resistant optical lenses.

More generally, Applicants have recognized and appreciated that it would be beneficial to provide a circuit board that provides satisfactory flame-retardant, fire enclosure, and/or shock-preventive characteristics. In view of the foregoing, various embodiments and implementations of the present invention are directed to methods and apparatus related to a circuit board assembly.

In the following detailed description, for purposes of explanation and not limitation, representative embodiments disclosing specific details are set forth in order to provide a thorough understanding of the claimed invention. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatus and methods may be omitted so as to not obscure the description of the representative embodiments. Such methods and apparatuses are clearly within the scope of the claimed invention.

Figure 1:
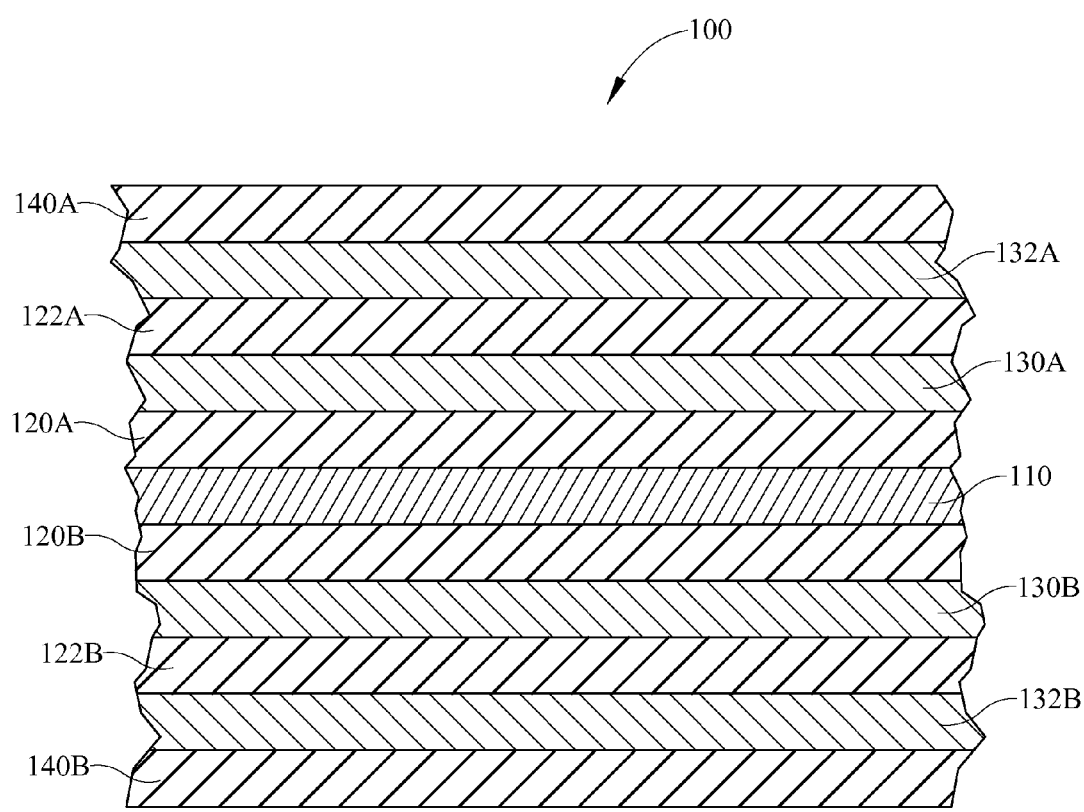
FIG. 1 illustrates a section view of a portion of a first embodiment of a circuit board assembly.

Referring to FIG. 1, in one embodiment, a metal core circuit board assembly 100 is provided having a metal core 110. In some embodiments, the metal core 110 may include or consist essentially of aluminum or an aluminum alloy. In other embodiments, alternative metal or metal alloy cores may be utilized. A first upper inner dielectric layer 120A is provided on a first side of the metal core 110 and contacts metal core 110. A first lower inner dielectric layer 120B is provided on an opposite second side of the metal core 110 and also contacts the metal core 110. A first upper conductive layer 130A is provided on a first side of the metal core 110 atop the first upper inner dielectric layer 120A. A first lower conductive layer 130B is provided on a second side of the metal core 110 atop the first lower inner dielectric layer 120B. A second upper inner dielectric layer 122A is provided atop the first upper conductive layer 130A and an outermost upper conductive layer 132A is provided atop the second upper inner dielectric layer 122A. A second lower inner dielectric layer 122B is provided atop the second lower inner dielectric layer 122B and an outermost lower conductive layer 132B is provided atop the second lower inner dielectric layer 122B.

With continued reference to FIG. 1, provided atop the outermost upper conductive layer 132A is an upper outer dielectric layer 140A and provided atop the outermost lower conductive layer 132B is a lower outer dielectric layer 140B. As described in additional detail herein, the dielectric layers 140A and/or 140B may include a plurality of openings that provide electrical and/or thermal access to one or more of conductive layers 130A, 130B, 132A, and/or 132B. For example, in some embodiments, upper outer dielectric layer 140A may include a plurality of openings that provide access to connection pads and/or vias that are in electrical connectivity with all of conductive layers 130A, 130B, 132A, and/or 132B and lower dielectric layer 140B may not include any openings that provide electrical access to conductive layers 130A, 130B, 132A, and/or 132B. Also, for example, in some embodiments, outer dielectric layer 140A may include a plurality of openings that provide electrical access to one or more of conductive layers 130A, 130B, 132A, and/or 132B and lower outer dielectric layer 140B may also include openings that provide electrical access to one or more of conductive layers 130A, 130B, 132A, and/or 132B.

In various embodiments, the conductive layers 130A, 130B, 132A, and 132B are in electrical and/or thermal connectivity with one or more connection pads and/or vias. For example, the outermost upper conductive layer 132A may be provided with a plurality of connection pads and may be in electrical connectivity with a plurality of the conductive layers 130B, 132A, and 132B through one or more vias. Also, for example, a plurality of vias may electrically interconnect one or more of conductive layers 130A, 130B, 132A, and 132B and one or more of the vias may be accessible through openings in outer dielectric layers 140A and/or 140B. Also, for example, the upper outermost conductive layer 132A may constitute a positive voltage layer and have a plurality of voltage connection pads accessible through outer dielectric layer 140A and the upper conductive layer 130A may constitute a neutral layer and have a plurality of neutral connection pads accessible through outer dielectric layer 140A. The connection pads and/or vias may optionally include solder and/or other fusible metal alloy applied over accessible portions of the conductive layers 130A, 130B, 132A, and/or 132B.

The conductive layers 130A, 130B, 132A, and 132B may optionally include conductor track structure in a desired configuration. For example, one or more of the conductive layers 130A, 130B, 132A, and 132B may include conductor track structure that includes a voltage track and a ground track. Also, one or more of the conductive layers 130A, 130B, 132A, and 132B may include conductor track structure that includes a plurality of control tracks. Also, other track structure may provide connection with other electrical components (surface mount components and/or interior components) and/or may be provided for thermal cooling. The conductive layers 130A, 130B, 132A, and 132B optionally may include one or more passive or active electrical components integrated therein and/or coupled thereto interiorly of the circuit board assembly 100.

In some embodiments, the conductive layers 130A, 130B, 132A, and/or 132B may be copper or a copper alloy. In other embodiments alternative metal or metal alloy conductive layers may additionally or alternatively be utilized. In some embodiments the inner dielectric layers 120A, 120B, 122A, and/or 122B may be, for example, FR-4, Nelco N4000-6, GETEK, BT epoxy glass, cyanate ester, and/or polymide glass. In other embodiments alternative dielectric materials may be utilized. In some embodiments, the outer dielectric layers 140A and 140B may be manufactured from one or more of the aforementioned dielectrics and/or from alternative dielectric materials.

The layers (110, 120A, 120B, 122A, 122B, 130A, 130B, 132A, 132B, 140A, and/or 140B) may be compressed together to form the circuit board assembly 100. In other embodiments other bonding methodologies may be utilized. A silkscreen and/or solder mask may optionally be applied to the outer dielectric layers 140A and/or 140B. For example, a silk screen may be applied to the outer dielectric layer 140A only. Also, for example, a solder mask may be applied to the outer dielectric layer 140A and solder subsequently applied such that solder coats portions of conductive layers 130A, 130B, 132A, and/or 132B accessible through openings in dielectric layer 140A.

Figure 2:
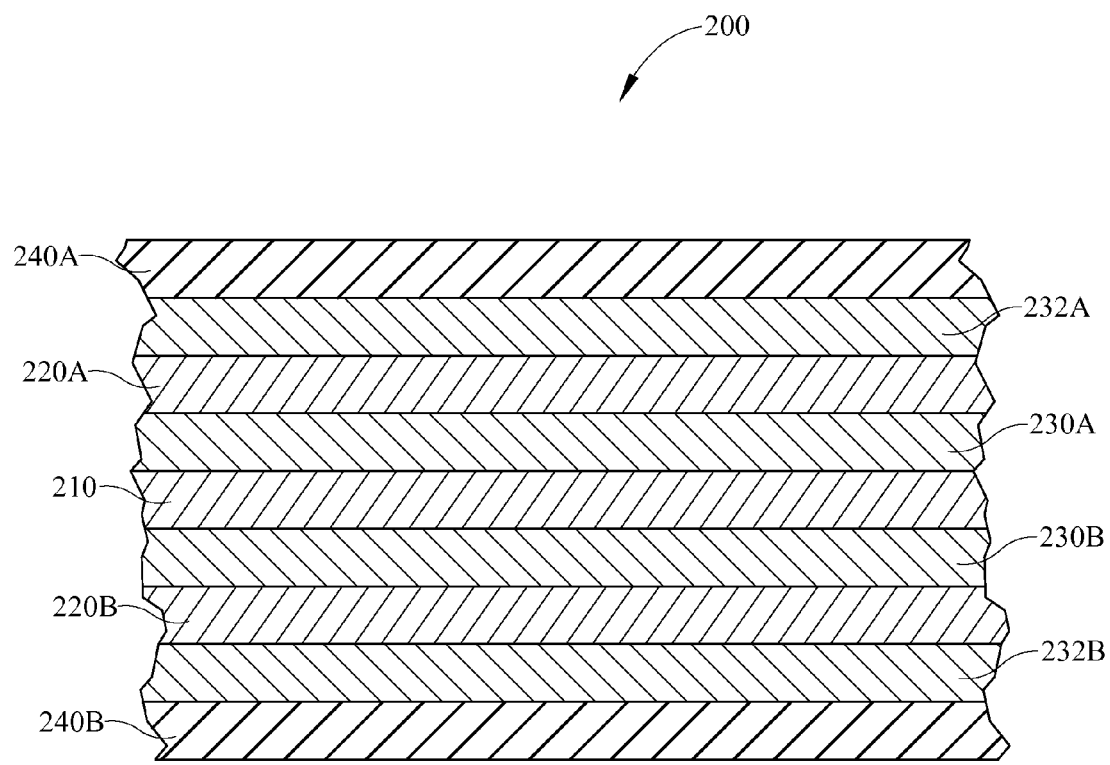
FIG. 2 illustrates a section view of a portion of a second embodiment of a circuit board assembly.

Referring to FIG. 2, in another embodiment, a prepreg core circuit board assembly 200 is provided having a prepreg core 210. In some embodiments the prepreg core 210 may be FR-4. In other embodiments alternative prepreg cores may be utilized such as, for example, FR-5, FR-6, CEM-3, CEM-4, and CEM-5. A first upper conductive layer 230A is provided on a first side of the prepreg core 210 and contacts the prepreg core 210. A first lower conductive layer 230B is provided on an opposite second side of the prepreg core 210 and also contacts the prepreg core 210. An upper inner dielectric layer 220A is provided on a first side of the prepreg core 210 atop the first upper conductive layer 230A. A lower inner dielectric layer 220B is provided on a second side prepreg core 210 atop the first lower conductive layer 230A. An outermost upper conductive layer 232A is provided atop the upper inner dielectric layer 220A and an outermost lower conductive layer 232B is provided atop the second lower inner dielectric layer 220B.

With continued reference to FIG. 2, provided atop the outermost upper conductive layer 232A is an upper outer dielectric layer 240A and provided atop the outermost lower conductive layer 232B is a lower outer dielectric layer 240B. As described in additional detail herein, the outer dielectric layers 240A and/or 240B may include a plurality of openings that provide electrical and/or thermal access to one or more of conductive layers 230A, 230B, 232A, and/or 232B. For example, in some embodiments upper outer dielectric layer 240A may include a plurality of openings that provide access to connection pads and/or vias that are in electrical connectivity with conductive layers 230A and 232A and lower dielectric layer 240B may include openings that provide electrical access to conductive layers 230B and 232B.

The conductive layers 230A, 230B, 232A, and 232B are in electrical and/or thermal connectivity with one or more connection pads and/or vias. For example, the outermost upper conductive layer 232A may be provided with a plurality of vias in electrical connectivity with a plurality of the conductive layers 230B, 232A, and 232B. The connection pads and/or vias may optionally include solder and/or other fusible metal alloy applied over such portions of the conductive layers 230A, 230B, 232A, and/or 232B. The conductive layers 230A, 230B, 232A, and 232B may optionally include conductor track structure in a desired configuration. For example, one or more of the conductive layers 230A, 230B, 232A, and 232B may include conductor track structure that includes a voltage track and a ground track. The conductive layers 230A, 230B, 232A, and 232B optionally may include one or more passive or active electrical components integrated therein and/or coupled thereto interiorly of the circuit board assembly 200.

In some embodiments, the conductive layers 230A, 230B, 232A, and/or 232B may be copper, copper alloy, and/or alternative metal or metal alloy. In some embodiments, the dielectric layers 220A, 220B, 240A, and 240 B may be, for example, FR-4, Nelco N4000-6, GETEK, BT epoxy glass, cyanate ester, polymide glass, and/or an alternative dielectric material.

The layers (210, 220A, 220B, 222A, 222B, 230A, 230B, 232A, 232B, 240A, and/or 240B) may be compressed together to form the circuit board assembly 200. In other embodiments, other bonding methodologies may be utilized. A silkscreen and/or solder mask may optionally be applied to the outer dielectric layers 240A and/or 240B. For example, a silk screen may be applied to the outer dielectric layer 240A only. Also, for example, a solder mask may be applied to the outer dielectric layer 240A and solder subsequently applied such that solder coats portions of conductive layers 230A, 230B, 232A, and/or 232B accessible through openings in dielectric layer 240A.

Figure 3:
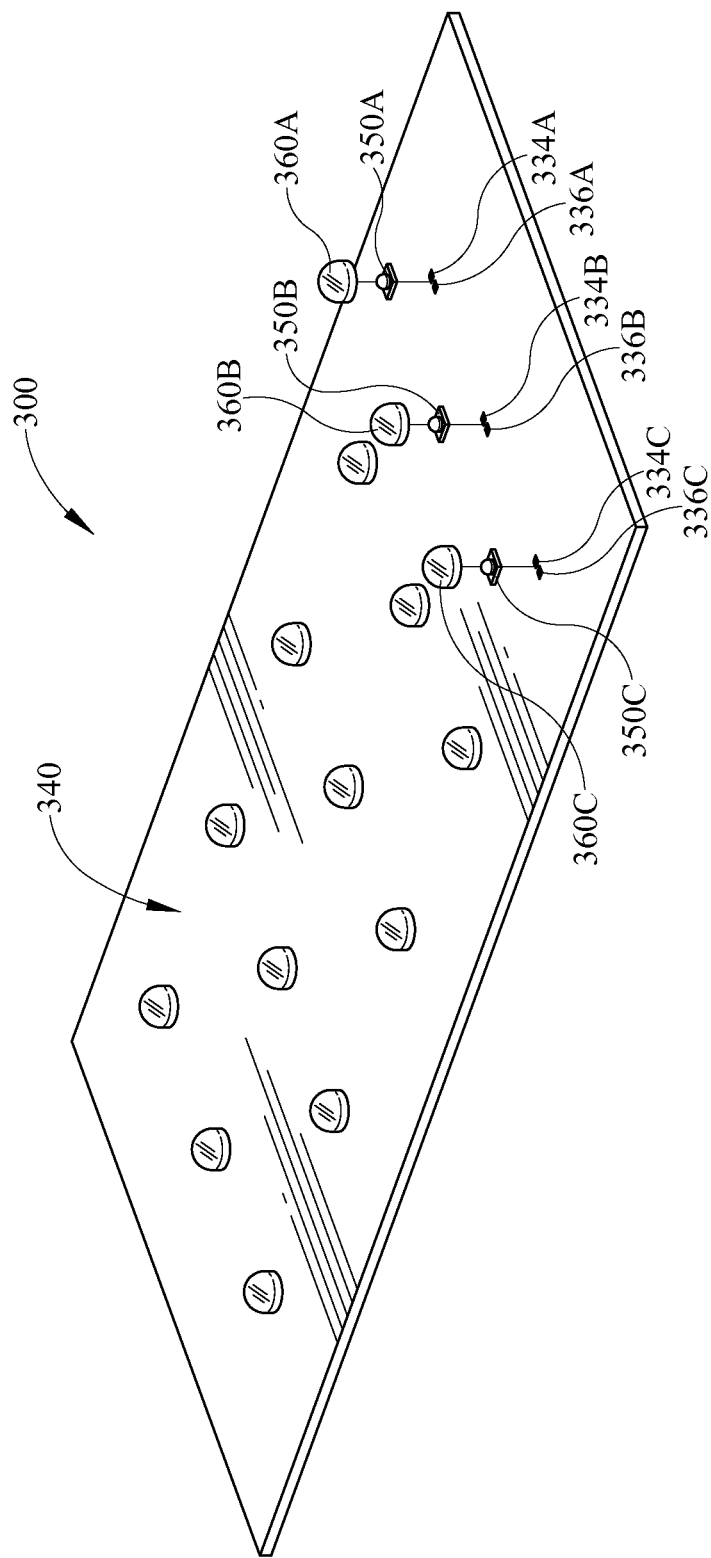
FIG. 3 illustrates an upper perspective view of a third embodiment of a circuit board assembly; three LEDs and three corresponding optical lenses provided over the LEDs are illustrated exploded away from the circuit board and from one another.
Figure 4:
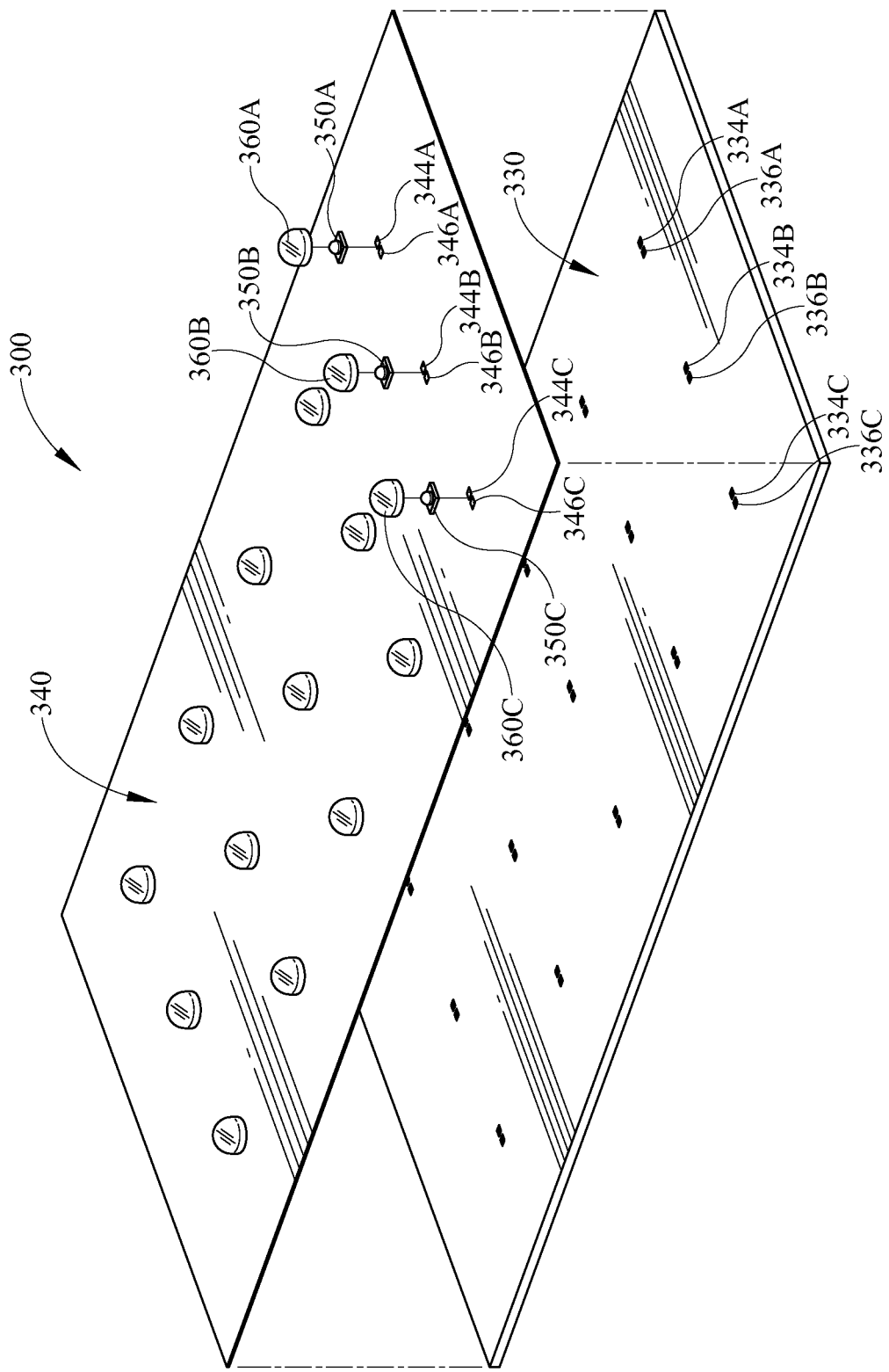
FIG. 4 illustrates an upper perspective view of the third embodiment of the circuit board assembly of FIG. 3; an outer dielectric layer is illustrated exploded away from an outer conductive layer of the circuit board; three LEDs and three corresponding optical lenses provided over the LEDs are illustrated exploded away from the circuit board and from one another.
Figure 5:
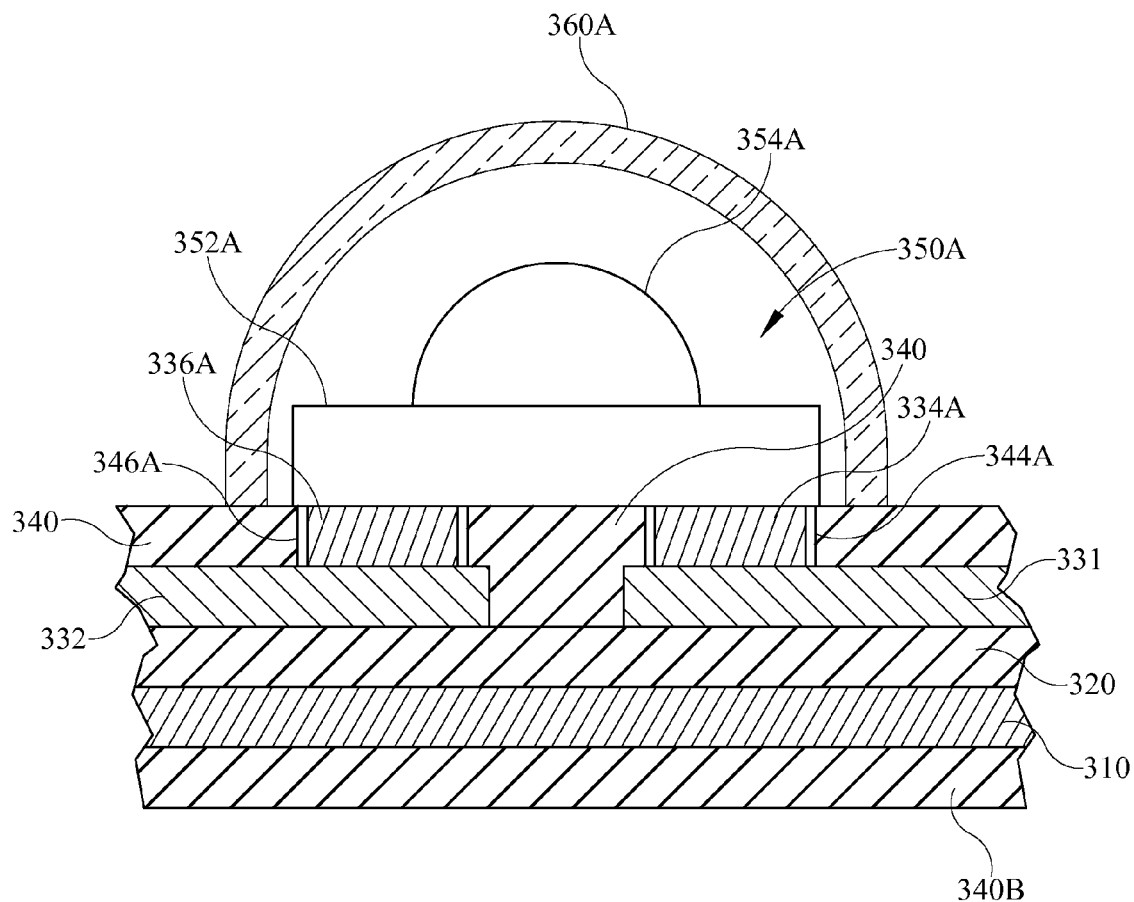
FIG. 5 illustrates a section view of a portion of the third embodiment of the circuit board assembly of FIG. 3.

Referring to FIGS. 3-5, in another embodiment, a circuit board assembly 300 is provided. The circuit board assembly 300 includes an outer dielectric layer 340 atop an outermost conductive layer 330. The dielectric layer extends across substantially all of conductive layer 330 and is continuous with the exception of a plurality of opening pairs provided therein for electrical connection of LEDs, as described in additional detail herein. Three LEDs 350A-C and three corresponding optical lenses 360A-C are depicted exploded away from the LED circuit board assembly 300 and from each other. Although only three LEDs 350A-C and three corresponding optical lenses 360A-C are labeled in FIGS. 3 and 4, it is understood that twelve additional optical lenses are depicted and that each of the optical lenses is provided atop a corresponding LED. In some embodiments one or more of the optical lenses may be non flame resistant optical lenses.

Each of the LEDs 350A-C is electrically coupled to a respective pair of connection pads 334A-C and 336A-C. The connections pads 344A-C and 336A-C are accessible through respective of openings 344A-C and 346A-C in outer dielectric layer 340. For example, connection pad 334A is accessible through opening 344A and connection pad 336A is accessible through opening 346A. In alternative embodiments instead of two separate openings 344A and 346A, more or fewer openings may be provided. For example, in some embodiments a single continuous opening may be provided that enables access to both connection pads 336A and connection pad 344A. Such a single continuous opening may be approximately the same size as the die base of a surface mount LED. Although only three pairs of connection pads 334A-C and 336A-C are labeled in FIGS. 3 and 4, it is understood that twelve additional connection pad pairs are depicted. Also, although only three pairs of openings 344A-C and 346A-C are visible in FIG. 4, it is understood that twelve additional opening pairs are provided, each being in line with a respective of a connection pair pad.

One or more of the openings in the outer dielectric layer 340 may be formed therein prior to compression of the outer dielectric layer 340 in some embodiments. For example, in some embodiments the openings may be formed utilizing drilling, milling, electrical discharge machining, electro chemical machining, electron beam machining, and/or other methods. In some embodiments one or more of the openings in the outer dielectric layer 340 may alternatively be formed therein after compression of the outer dielectric layer 340. For example, in some embodiments the openings may be formed utilizing etching methods such as chemical etching.

The connection pads 344A-C and 336A-C may be portions of conductive track structure from conductive layer 330 and/or may be solder material that is provided atop the conductive layer 330. The connection pads 344A-C are electrically connected to positive voltage track structure 331 (FIG. 5) of conductive layer 330. The connection pads 336A-C are electrically connected to neutral voltage track structure 332 (FIG. 5) of conductive layer 330. In alternative embodiments the polarity of track structures 331 and 332 may be reversed. Although conductive layer 330 is depicted as a solid sheet with connection pads thereon in FIG. 4, it is understood that the connection pads are actually coupled to distinct track structures of the conductive layer 330. In particular, connection pads 344A-C are coupled to the positive track structure 331 and connection pads 346A-C are coupled to the neutral track structure 332. The positive track structure 331 and the neutral track structure 332 are electrically isolated from one another. Optionally, the outer dielectric layer 340, an inner dielectric layer 320A, and/or other applied dielectric may extend between the positive track structure 331 and the neutral track structure 332 to aid in isolating the track structures 331 and 332.

One or more electrical connection structures may also be electrically coupled to the track structures 331 and 332 to provide power from an external power source (e.g., an LED driver) to the track structures 331 and 332. For example, one or more additional openings may be provided through outer dielectric layer 340 providing access to track structure 331 and 332. A connection plug or connection member may then be placed over the opening(s) and electrically coupled to connection pads of the track structures 331 and 332. One or more additional electrical components may also optionally be additionally coupled to circuit board assembly 300. For example, a controller may optionally be placed over an opening in outer dielectric layer 340 and electrically coupled to track structures 331 and/or 332 (or other separate track(s) in outermost conductive layer 330 such as a control track structure) to thereby control one or more parameters of the light output of the LEDs.

Referring particularly to FIG. 5, a section view of a portion of the third embodiment of the circuit board assembly 300 is illustrated. The die base 352A of the surface mount LED 350A covers openings 344A and 346A. The die base 352A includes a positive electrical contact that is in electrical connectivity with positive connection pad 334A and a neutral electrical contact that is in electrical connectivity with neutral connection pad 336A. The connection pads 334A and 336A are depicted in FIG. 5 as being separate from LED 350A and conductive layer 330 and extending upwardly from conductive layer 330. However, it is understood that in alternative embodiments the connection pads may be integrally formed with and/or coplanar with conductive layer 330. When all the LEDs of the circuit board assembly 300 are coupled over respective openings and placed in electrical contact with respective connection pads, access to the conductive layer 330 is prohibited by virtue of the LEDs and the outer dielectric layer 340. The optical lens 360A extends over top of LED 350A and alters light that exits through LED dome 354A and is incident thereon. In some embodiments the optical lens 360A may be a non flame resistant optical lens. In some versions of those embodiments all of the optical lenses may be non flame resistant. A lower outer dielectric layer 340B is visible in FIG. 5. The lower outer dielectric layer 340B may optionally be continuous and be provided over the entirety of metal core 310. In alternative embodiment the lower outer dielectric layer 340B may optionally be omitted.

Although particular LEDs and optical lenses are depicted herein, one of ordinary skill in the art having had the benefit of the present disclosure will recognize and appreciate that other LEDs and/or optical lenses may be utilized in implementations of the circuit board assembly that are configured for utilization with LEDs. For example, LEDs having different surface mount dies may be utilized. Also, for example, LEDs utilizing through hole or other circuit board mounting technology may be utilized. Also, for example, LEDs having a different dome configuration may be utilized. Also, for example, optical lenses that include a collimator and/or a reflector may be utilized. Also, for example, optical lenses that redirect light in an off-axis manner may be utilized. Also, although a particular conductive layer 330 has been depicted and described herein one of ordinary skill in the art having had the benefit of the present disclosure will recognize and appreciate that other conductive layer configurations may be provided and/or multiple conductive layers may be provided. For example, in some embodiments at least two conductive layers may be provided. Optionally, one conductive layer may only include positive track structure and a second conductive layer may only include neutral track structure. Also, for example, in some embodiments a single layer may be dedicated to control of the LEDs and optionally to control of one or more other electrical components (e.g., cooling fan and/or liquid pump for cooling).

Figure 6:
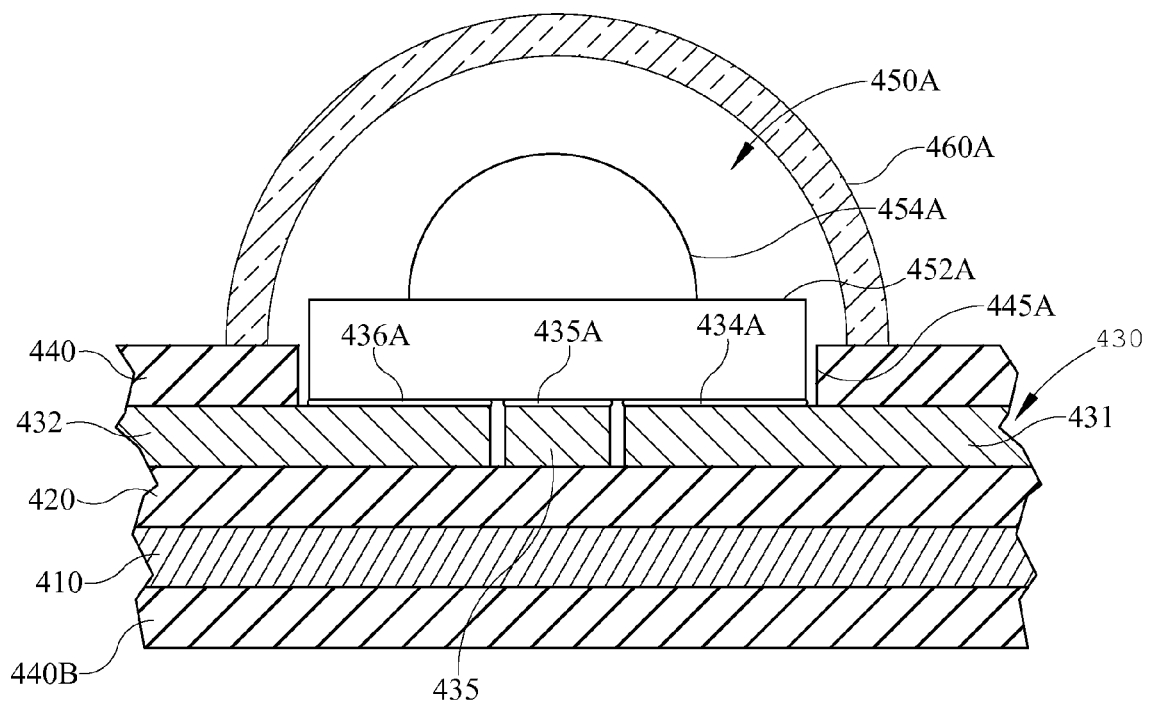
FIG. 6 illustrates a section view of a portion of a fourth embodiment of a circuit board assembly.

FIG. 6 illustrates a section view of a portion of yet another embodiment of a circuit board assembly. The die base 452A of a surface mount LED 450A is positioned in a singular opening 445A through outer dielectric layer 440. The outer dielectric layer 440 has a plurality of singular openings that are sized to surround an LED die base as opposed to opening pairs each sized to allow contacts of the LED base to access a connection pad. The die base 452A includes a positive electrical contact that is in electrical connectivity with positive connection pad 434A and a neutral electrical contact that is in electrical connectivity with neutral connection pad 436A. The positive connection pad 434A is in electrical contact with positive track structure 432 and the neutral connection pad 436A is in electrical contact with neutral track structure 436. The die base 452A also includes a thermal contact that is in electrical connectivity with a thermal connection pad 435A. The thermal connection pad 435A is in connectivity with thermal track structure 435 of conductive layer 430. The thermal track structure 435 is for thermal management and may optionally be thermally coupled to additional conductive layers in alternative embodiments. The connection pads 434A, 435A, and 436A are depicted in FIG. 6 as being separate from LED 450A and conductive layer 430 and extending upwardly from conductive layer 430. However, it is understood that in alternative embodiments the connection pads may be integrally formed with and/or coplanar with conductive layer 430.

A small gap is present between opening 445A and die base 452A. In some embodiments, the gap is less than a "finger width" as defined by UL, and, in a particular embodiment, the gap is approximately 1 millimeter or less.

When LED 450A is received in the opening 445A and placed in contact with connection pads 434A, 435A, and 436A, physical access to the conductive layer 430 by a user is prohibited by virtue of the LED 450A and the outer dielectric layer 440. Although only a portion of the circuit board assembly is shown it is understood that the circuit board assembly may have additional LEDs and/or other electrical components in addition to the LED 450A depicted in FIG. 6. Such electrical components may similarly be received in an opening through outer dielectric layer 440 and prevent physical access to the conductive layer 430. The optical lens 460A extends over top of LED 450A, is positioned atop the dielectric layer 440, and alters light that exits through LED dome 454A and is incident thereon. In some embodiments the optical lens 460A may be a non flame resistant optical lens. A metal core layer 410, an inner dielectric layer 420, and a lower outer dielectric layer 440B are also visible in FIG. 6. The lower outer dielectric layer 440B may optionally be continuous and be provided over the entirety of metal core 410. In an alternative embodiment, the lower outer dielectric layer 440B may optionally be omitted. One or more conductive layers may be interposed between metal core 410 and lower outer dielectric layer 440B and a plurality of openings may be provided through lower outer dielectric layer 440B. Optionally, the openings may provide electrical access to conductive layer(s) for electrical components while preventing physical access to such conductive layer(s) by a user.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. It should also be understood that, unless clearly indicated to the contrary, in any methods claimed herein that include more than one step or act, the order of the steps or acts of the method is not necessarily limited to the order in which the steps or acts of the method are recited.

Reference numerals appearing in the claims between parentheses, if any, are provided merely for convenience and should not be construed as limiting in any way.

What is claimed is:

1. A circuit board assembly, comprising:
    a core layer;
    at least one conductive layer positioned on a first side of said core layer, said at least one conductive layer and said core layer cohesively bonded together and forming a cohesive circuit board;
    a plurality of connection pads in electrical connectivity with said at least one conductive layer;
    a dielectric bottom layer positioned on a second side of said core layer and forming a part of said cohesive circuit board, said second side opposite said first side;
    an outer dielectric layer directly atop an outermost of said at least one conductive layer, said outer dielectric layer including a plurality of openings, each of said plurality of openings providing electrical access to one of said plurality of connection pads;
        wherein said outer dielectric layer forms part of said cohesive circuit board, is substantially exposed and is substantially continuous except for said plurality of openings; and
    a plurality of LEDs, each of said plurality of LEDs electrically connected to a single of said plurality of connection pads;
    wherein said plurality of LEDs substantially cover said plurality of connection pads when electrically connected thereto.

2. The circuit board assembly of claim 1, wherein said core layer comprises aluminum.

3. The circuit board assembly of claim 2, further comprising a dielectric inner layer immediately atop said core layer on said first side thereof.

4. The circuit board assembly of claim 1, wherein said core layer comprises a pre-preg material.

5. The circuit board assembly of claim 1, further comprising a plurality of said at least one conductive layers.

6. The circuit board assembly of claim 5, further comprising a dielectric inner layer provided between two of said at least one conductive layers.

7. The circuit board assembly of claim 1, further comprising a plurality of non-fire rated optical lenses each placed over one of said plurality of LEDs.

8. The circuit board assembly of claim 1, wherein said plurality of connection pads are cohesively integrally formed with said at least one conductive layer.

9. The circuit board assembly of claim 1 further comprising:
- at least one bottom conductive layer placed on said second side of said core layer;
- wherein said core layer, said at least one conductive layer and said at least one bottom conductive layer are cohesively bonded together.

10. The circuit board assembly of claim 9, wherein said dielectric bottom layer is directly below an outermost of said at least one bottom conductive layer.

11. The circuit board assembly of claim 10, wherein said dielectric bottom layer is continuous.

12. The circuit board assembly of claim 10, wherein said dielectric bottom layer includes a plurality of bottom openings providing electrical access to said at least one bottom conductive layer.

13. The circuit board assembly of claim 9, further comprising a plurality of said at least one conductive layers.

14. The circuit board assembly of claim 13 further comprising a dielectric inner layer provided between two of said at least one conductive layers.

15. The circuit board assembly of claim 9 wherein said plurality of connection pads comprise solder bonded to said at least one conductive layer.

16. A method of manufacturing a circuit board assembly, comprising:
- positioning an outermost conductive layer on a first side of a core layer; said outermost conductive layer including a plurality of connection pads;
- positioning an outer dielectric layer directly atop said outermost conductive layer and aligning each of a plurality of openings in said outer dielectric layer with a single of said plurality of connection pads;
- compressing said core layer, said outermost conductive layer, and said outer dielectric layer together to form a circuit board;
- coupling each of a plurality of electrical components to a single of said plurality of connection pads; wherein said plurality of electrical components prevent external physical access to said plurality of connection pads when coupled thereto.

17. The method of claim 16 further comprising positioning a dielectric inner layer directly atop said core layer.

18. The method of claim 16 wherein said plurality of electrical components include LEDs.

19. The method of claim 18 further comprising positioning a plurality of non-fire rated optical lenses over said LEDs.

20. The method of claim 16 wherein said outermost conductive layer comprises copper.

* * * * *